United States Patent [19]
Forbes et al.

[11] Patent Number: 6,143,636
[45] Date of Patent: *Nov. 7, 2000

[54] HIGH DENSITY FLASH MEMORY

[75] Inventors: Leonard Forbes, Corvallis, Oreg.; Wendell P. Noble, Milton, Vt.

[73] Assignee: Micron Technology, Inc., Boise, Id.

[ * ] Notice: This patent is subject to a terminal disclaimer.

[21] Appl. No.: 09/137,328

[22] Filed: Aug. 20, 1998

Related U.S. Application Data

[62] Division of application No. 08/889,553, Jul. 8, 1997.

[51] Int. Cl.$^7$ .................. H01L 21/3205; H01L 21/4763
[52] U.S. Cl. .................. 438/587; 438/259; 438/212; 438/268; 257/315; 257/319
[58] Field of Search .................. 438/259, 257, 438/587; 257/319

[56] References Cited

U.S. PATENT DOCUMENTS

| | | | |
|---|---|---|---|
| 4,051,354 | 9/1977 | Choate | 235/312 |
| 4,604,162 | 8/1986 | Sobczak | 156/657 |
| 4,663,831 | 5/1987 | Birrittella et al. | 29/576 E |
| 4,673,962 | 6/1987 | Chatterjee et al. | 357/23.6 |
| 4,761,768 | 8/1988 | Turner et al. | 365/201 |
| 4,766,569 | 8/1988 | Turner et al. | 365/185 |
| 4,920,065 | 4/1990 | Chin et al. | 437/52 |
| 4,958,318 | 9/1990 | Harari | 365/149 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,223,081 | 6/1993 | Doan | 156/628 |
| 5,266,514 | 11/1993 | Tuan et al. | 437/52 |

(List continued on next page.)

FOREIGN PATENT DOCUMENTS 363066963A  3/1998  Japan .................. 257/305

OTHER PUBLICATIONS

Adler, E., et al., "The Evolution of IBM CMOS DRAM Technology", 167–188, (Jan./Mar., 1995).

Asai, S., et al., "Technology Challenges for Integration Near and Below 0.1 micrometer", *Proceedings of the IEEE*, 85, Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80, (May 28–30, 1986).

*Primary Examiner*—Matthew Smith
*Assistant Examiner*—Belur Keshavan
*Attorney, Agent, or Firm*—Schwegman, Lundberg, Woessner & Kluth, P.A.

[57] ABSTRACT

A high density flash EEPROM provides increased nonvolatile storage capacity. A memory cell array includes densely packed memory cells, each cell having a semiconductor pillar providing shared source/drain regions for two vertical floating gate transistors that have individual floating and control gates distributed on opposing sides of the pillar. The control gates are formed together with interconnecting gate lines. First source/drain terminals are row addressable by interconnection lines disposed substantially orthogonal to the gate lines. Second source/drain terminals are column addressable by data lines disposed substantially parallel to the gate lines. Both bulk semiconductor and silicon-on-insulator embodiments are provided. If a floating gate transistor is used to store a single bit of data, an area of only $2F^2$ is needed per bit of data, where F is the minimum lithographic feature size. If multiple charge states (more than two) are used, an area of less than $2F^2$ is needed per bit of data.

14 Claims, 14 Drawing Sheets

U.S. PATENT DOCUMENTS

| | | | |
|---|---|---|---|
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,422,499 | 6/1995 | Manning | 257/67 |
| 5,427,972 | 6/1995 | Shimizu et al. | 437/52 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,640,342 | 6/1997 | Gonzalez | 365/156 |
| 5,644,540 | 7/1997 | Manning | 365/200 |
| 5,646,900 | 7/1997 | Tsukude et al. | 365/230 |
| 5,691,230 | 11/1997 | Forbes | 437/62 |
| 5,705,415 | 1/1998 | Orlowski et al. | 437/43 |
| 5,936,274 | 8/1999 | Forbes et al. | 257/315 |
| 5,973,356 | 10/1999 | Noble et al. | 257/319 |

OTHER PUBLICATIONS

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", *Proceedings of the 1996 IEEE International SOI Conference*, Sanibel Island, FL, 20–21, (Sep. 30–Oct. 3, 1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", *Proceedings of the 8th Annual IEEE International ASIC Conference and Exhibit*, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", In: *Analysis and Design of Digital Integrated Circuits, 2nd Edition*, McGraw–Hill Book Co., New York, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Hu, G., et al., "Will Flash Memory Replace Hard Disk Drive?", *1994 IEEE International Electron Device Meeting*, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study of Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31(4), 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD*, 15, p. 42, (Jul. 1972).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (Simple) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov. 1995).

Pein, H.B., et al., "Performance of the 3–D Sidewall Flash EPROM Cell", *IEEE International Electron Devices Meeting, Technical Digest*, 11–14, (1993).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAMs using Quarter––Micron Phase–Shift Lithography", *1992 Symposium on VLSI Technology, Digest of Technical Papers*, Seattle, WA, 10–11, (Jun. 2–4, 1992).

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "A 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stellwag, T.B., et al., "A Vertically–Integrated GaAs Bipolar DRAM Cell", *IEEE Transactions on Electron Devices*, 38, 2704–2705, (Dec. 1991).

Suma, K., et al., "An SOI–DRAM with Wide Operating Voltage Range by CMOS/SIMOX Technology", *IEEE Journal of Solid–State Circuits*, 29(11), 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", *1990 IEEE International Electron Devices Meeting*, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Wang, N., *Digital MOS Integrated Circuits*, Prentice Hall, Inc., Englewood Cliffs, NJ, p. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", *1996 Symposium on VLSI Technology, Digest of Technical Papers*, Honolulu, HI, 240–241, (Jun. 11–13, 1996).

HIGH DENSITY FLASH MEMORY

CROSS REFERENCE TO RELATED APPLICATIONS

This application is a divisional of U.S. patent application Ser. No. 08/889,553, filed Jul. 8, 1997 (the '553 Application). The '553 Application is incorporated herein by reference.

This application is related to co-pending, commonly assigned patent application Ser. No. 08/889,554, filed on Jul. 8, 1997, which disclosure is herein incorporated by reference.

TECHNICAL FIELD OF THE INVENTION

This invention relates generally to integrated circuits, and particularly to floating gate transistor structures for use in nonvolatile semiconductor memories such as in flash EEPROM memory cells.

BACKGROUND OF THE INVENTION

Electrically erasable and programmable read only memories (EEPROMS) are reprogrammable nonvolatile memories that are widely used in computer systems for storing data both when power is supplied or removed The typical data storage element of an EEPROM is a floating gate transistor, which is a field-effect transistor (FET) having an electrically isolated (floating) gate that controls electrical conduction between source and drain regions. Data is represented by charge stored on the floating gate and the resulting conductivity obtained between source and drain regions.

Increasing the storage capacity of EEPROM memories requires a reduction in the size of the floating gate transistors and other EEPROM components in order to increase the EEPROM's density. However, memory density is typically limited by a minimum lithographic feature size (F) that is imposed by lithographic processes used during fabrication. For example, the present generation of high density dynamic random access memories (DRAMs), which are capable of storing 256 Megabits of data, require an area of $8F^2$ per bit of data There is a need in the art to provide even higher density memories in order to further increase storage capacity.

SUMMARY OF THE INVENTION

The present invention includes a high density electrically erasable and programmable read only memory (EEPROM) providing increased nonvolatile storage capacity. The memory allows simultaneous erasure of multiple data bits, and is referred to as flash EEPROM. Both bulk semiconductor and semiconductor-on-insulator embodiments are included.

In one embodiment of the invention, a memory cell includes a pillar of semiconductor material that extends outwardly from a working surface of a substrate. The pillar includes source/drain and body regions and has a number of sides. A number of floating gates are included in each memory cell, for example a pair of floating gates on opposing sides of the pillar. Each gate is associated with a side of the pillar. A number of control gates are also included in each memory cell. Each control gate is associated with a floating gate so as to allow selective storage and retrieval of data on the floating gates. In one embodiment, the control gate is capable of storing more than two charge states on its associated floating gate.

In another embodiment of the invention, a floating gate transistor is fabricated upon a substrate. The floating gate transistor includes a first conductivity type semiconductor pillar. The pillar has top and side surfaces and is formed upon the substrate. A first source/drain region, of a second conductivity type, is formed proximal to an interface between the pillar and the substrate. A second source/drain region, of a second conductivity type, is formed in a portion of the pillar that is distal to the substrate and separate from the first source/drain region. A gate dielectric is formed on at least a portion of the side surface of the pillar. A floating gate is formed substantially adjacent to a portion of the side surface of the pillar and separated therefrom by the gate dielectric. A control gate is formed substantially adjacent to the floating gate and insulated therefrom. An intergate dielectric is formed, interposed between the floating and control gates.

In another embodiment of the invention, a memory cell is fabricated upon a substrate. The memory cell includes a first conductivity type semiconductor pillar. The pillar has top and side surfaces and is formed upon the substrate. A first source/drain region, of a second conductivity type, formed proximal to an interface between the pillar and the substrate. A second source/drain region, of a second conductivity type, is formed in a portion of the pillar that is distal to the substrate and separate from the first source/drain region. A gate dielectric is formed on at least a portion of the side surface of the pillar. A plurality of floating gates are formed, for example a pair of floating gates on opposing sides of the pillar. Each floating gate is substantially adjacent to a portion of the side surface of the pillar and separated therefrom by the gate dielectric. A plurality of control gates are formed, each of which is substantially adjacent to one of the floating gates and insulated therefrom. An intergate dielectric is formed, interposed between each of the substantially adjacent floating and control gates.

In another embodiment of the invention a nonvolatile memory array is fabricated upon a substrate. The memory array includes a plurality of memory cells, as described above. The memory array also includes a plurality of gate lines, e.g. substantially parallel in a first direction. Each gate line interconnects ones of the control gates in ones of the memory cells. At least one first source/drain interconnection line is formed, e.g. at least partially within the substrate. The first source/drain interconnection line interconnects ones of the first source/drain regions of ones of the memory cells. A plurality of data lines is formed. Each data line interconnects ones of the second source/drain regions of ones of the memory cells.

In another embodiment, the present invention provides a method of forming a memory array. The method includes several steps, as described below. A plurality of first conductivity type semiconductor pillars are formed upon a substrate. Each pillar has top and side surfaces. A plurality of first source/drain regions, of a second conductivity type, are formed. Each of the first source/drain regions is formed proximally to an interface between the pillar and the substrate. A plurality of second source/drain regions, of a second conductivity type, is formed. Each of the second source/drain regions is formed within one of the pillars and distal to the substrate and separate from the first source drain region. A gate dielectric is formed on at least a portion of the side surfaces of the pillars. A plurality of floating gates is formed. Each of the floating gates is formed substantially adjacent to a portion of the side surface of one of the pillars and separated therefrom by the gate dielectric. A plurality of control gates is formed. Each of the control gates is formed substantially adjacent to one of the floating gates and insulated therefrom. An intergate dielectric is formed, interposed between ones of the floating gates and ones of the control gates. A plurality of gate lines is formed. Each gate line interconnects ones of the control gates. At least one first source/drain interconnection line is formed, e.g. at least partially within the substrate. The first source/drain interconnection line interconnects ones of the first source/drain regions. A plurality of data lines is formed. Each data line interconnects ones of the second/source drain regions.

In one embodiment, the method of forming a memory array on a substrate includes forming a first source/drain layer at a surface of the substrate. A semiconductor epitaxial layer is formed on the first source/drain layer. A second source/drain layer is formed at a surface of the epitaxial layer. A plurality of substantially parallel first troughs are etched, in a first direction, in the epitaxial layer. The first troughs are filled with an insulator. A plurality of substantially parallel second troughs are etched in the epitaxial layer, in a second direction that is substantially orthogonal to the first direction. A gate dielectric layer is formed substantially adjacent to sidewall regions of the second troughs. A conductive layer is formed in the second troughs. A portion of the conductive layer in the second troughs is removed, such that floating gate regions are formed along the sidewall regions therein and separated from the sidewall regions by the gate dielectric layer. An intergate dielectric layer is formed on exposed portions of the floating gate regions in the second troughs. Control gate regions and gate lines are formed between opposing floating gate regions in the second troughs and separated from the floating gate regions in the second troughs by the intergate dielectric layer.

Thus, bulk semiconductor and semiconductor-on-insulator embodiments of the present invention provide a high density flash EEPROM having increased nonvolatile storage capacity. If a floating gate transistor is used to store a single bit of data, an area of only $2F^2$ is needed per bit of data, where F is the minimum lithographic feature size. If multiple charge states (more than two) are used, an area of less than $2F^2$ is needed per bit of data The increased storage capacity of the flash EEPROM is particularly advantageous in replacing hard disk drive data storage in computer systems. In such an application, the delicate mechanical components included in the hard disk drive are replaced by rugged, small, and durable solid-state flash EEPROM packages. The flash EEPROMs provide improved performance, extended rewrite cycles, increased reliability, lower power consumption, and improved portability.

BRIEF DESCRIPTION OF THE DRAWINGS

In the drawings, like numerals describe substantially similar components throughout the several views.

DETAILED DESCRIPTION OF THE INVENTION

Figure 1:
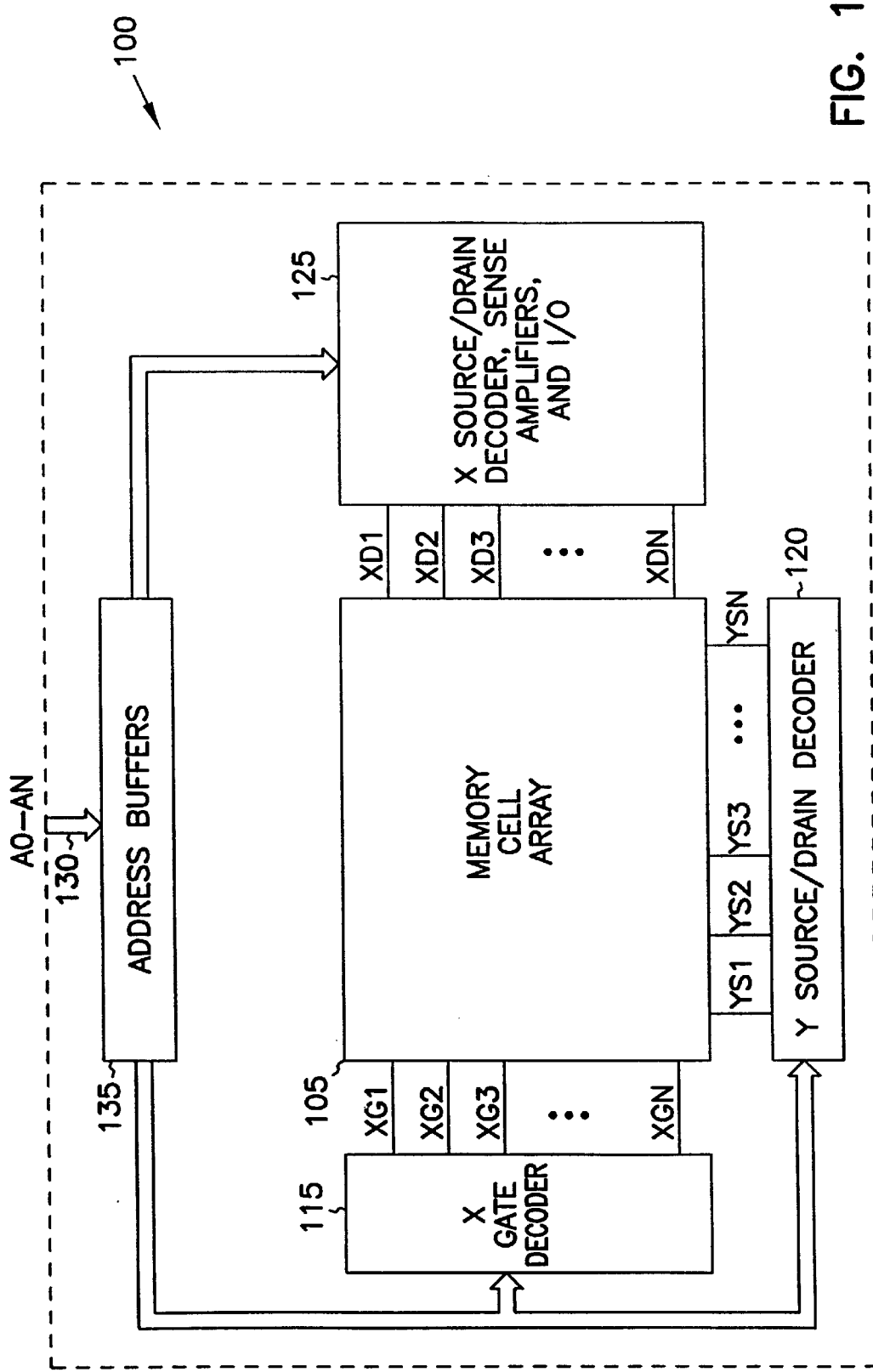
FIG. 1 is a schematic/block diagram illustrating generally an architecture of one embodiment of a nonvolatile memory, according to the teachings of the invention, including an array having a plurality of memory cells.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art, including bulk semiconductor and semiconductor-on-insulator (SOI) substrates. In the drawings, like numerals describe substantially similar components throughout the several views. The following detailed description is not to be taken in a limiting sense.

FIG. 1 is a schematic/block diagram illustrating generally an architecture of one embodiment of a memory 100 according to the present invention. In the embodiment of FIG. 1, memory 100 is a nonvolatile high density electrically erasable and programmable read only memory (EEPROM allowing simultaneous erasure of multiple data bits, referred to as flash EEPROM. However, the invention can be applied to other semiconductor memory devices, such as static or dynamic random access memories (SRAMs and DRAMs, respectively), synchronous random access memories or other types of memories that include a matrix of selectively addressable memory cells.

Memory 100 includes a memory cell array 105, having memory cells therein that include floating gate transistors, as described below. X gate decoder 115 provides a plurality of gate lines, XG1, XG2, . . . , XGN for addressing floating gate transistors in array 105, as described below. Y source/drain decoder 120 provides a plurality of first source/drain interconnection lines YS1, YS2, . . . , YSN, for accessing first source/drain regions of the floating gate transistors in array 105, as described below. In an embodiment in which commonly connected first source/drain interconnection lines YS1, YS2, . . . , YSN are used, Y source/drain decoder 120 may be omitted. X source/drain decoder 125 provides a plurality of data lines, XD1, XD2, . . . , XDN for accessing second source/drain regions of the floating gate transistors in array 105, as described below. X source/drain decoder 125 also typically includes sense amplifiers and input/output (I/O) circuitry for reading, writing, and erasing data to and from array 105. In response to address signals A0–AN that are provided on address lines 130 during read, write, and erase operations, address buffers 135 control the operation of X gate decoder 115, Y source/drain decoder 120, and X source/drain decoder 125. The address signals A0–AN are provided by a controller such as a microprocessor that is fabricated separately or together with memory 100, or otherwise provided by any other suitable circuits. As described in detail below, the address signals A0–AN are decoded by X gate decoder 115, Y source/drain decoder 120, and X source/drain decoder 125 to perform reading, writing, and erasing operations on memory cells that include a number of vertical floating gate field-effect transistors (FETs) formed on the sides of a semiconductor pillar on a substrate.

Figure 2:
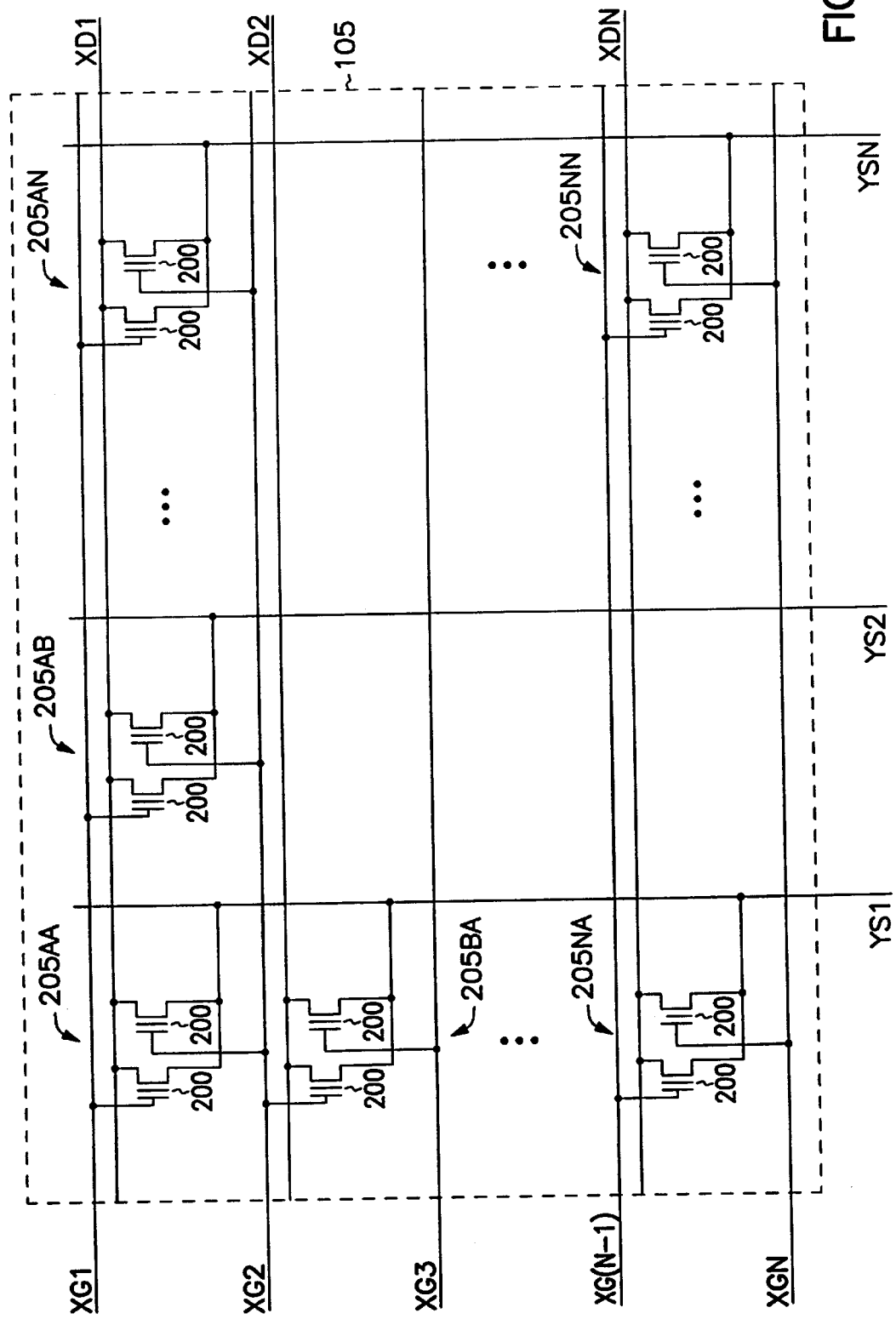
FIG. 2 is a schematic diagram illustrating generally one embodiment of an array of memory cells according to the teachings of the invention.

FIG. 2 is a schematic diagram illustrating generally one embodiment of array 105 in more detail. In FIG. 2, each memory cell 205 comprises two floating gate transistors 200, e.g. two field-effect transistors (FETs), each having an electrically isolated (floating) gate that controls electrical conduction between source and drain regions. The floating gate transistors 200 are arranged in cells 205, such as cells 205AA, 205BA, . . . , 209A, in a first direction, e.g. in the Y-direction of the first source/drain interconnection lines YS1, YS2, . . . ,YSN, and in cells such as 205AA, 205AB, . . . , 205AN in a second direction, e.g. in the X-direction of the data lines, XD1, XD2, . . . , XDN. In the embodiment of FIG. 2, each cell 205 includes two floating gate transistors 200 that share a common first source/drain region, such as a source region coupled to one of the first source/drain interconnection lines YS1, YS2, . . . , YSN. The floating gate transistors 200 of each cell 205 also share a common second source/drain region, such as a drain region coupled to one of the data lines, XD1, XD2, . . . , XDN. Each cell 205 has first and second source/drain regions that are fabricated using a common semiconductor pillar on a substrate, as explained below.

Figure 3A:
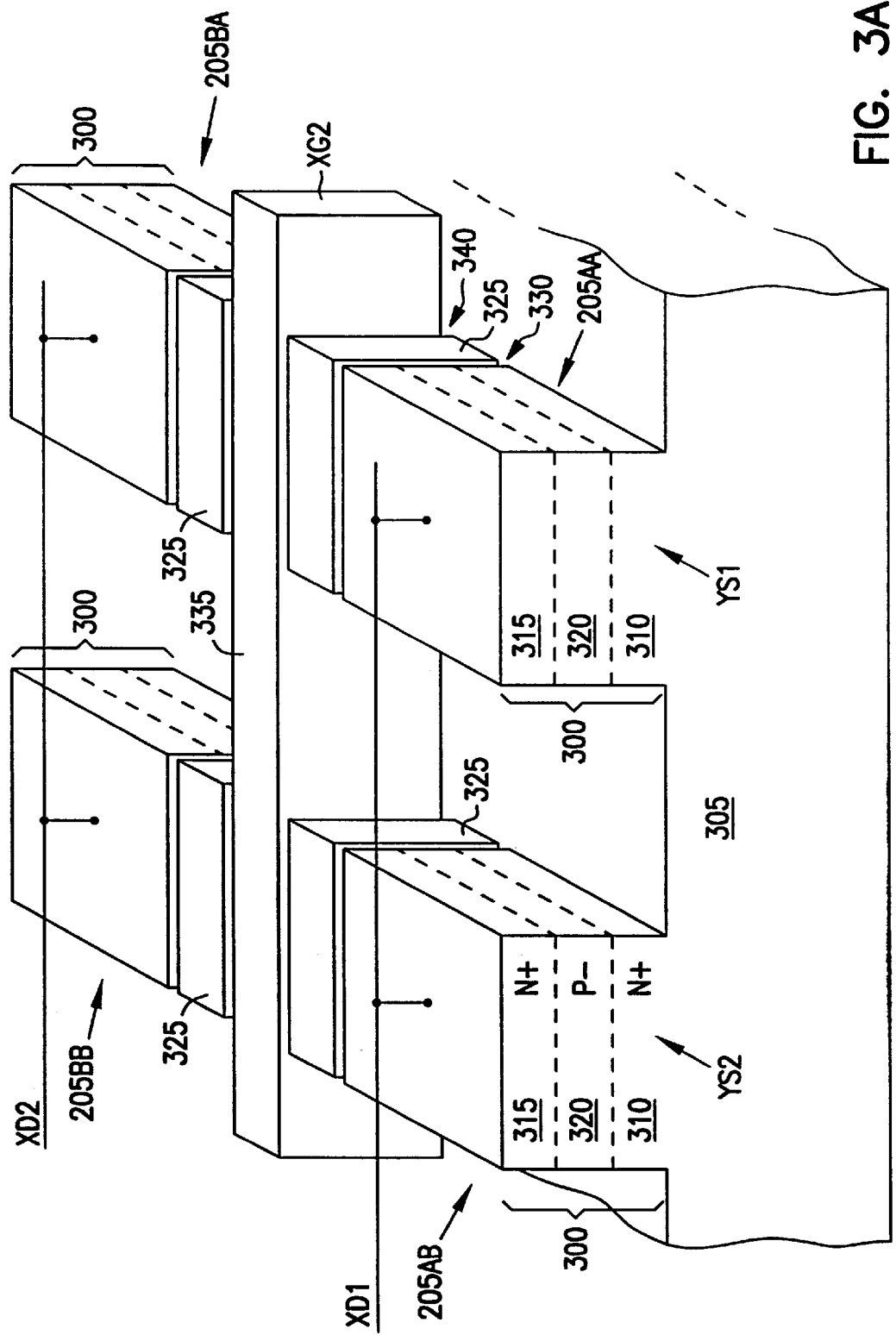
FIG. 3A is a perspective view illustrating generally one embodiment of a portion of an array of memory cells according to the teachings of the invention.

FIG. 3A is a perspective view illustrating generally one embodiment of a portion of array 105, including portions of four cells 205 of floating gate transistors 200, such as illustrated in FIG. 2. In FIG. 3A, the substantially identical cells 205 are illustrated by way of example through cells 205AA, 205BA, 205AB, and 205BB. Each cell 205 includes a semiconductor pillar 300, initially of a first conductivity type such as P− silicon, fabricated upon a monolithic substrate 305. In one embodiment, substrate 305 is a bulk semiconductor, such as P− silicon. In another embodiment, a semiconductor-on-insulator (SOI) substrate 305 includes an insulating layer, such as silicon dioxide ($SiO_2$), as described below.

Each pillar 300 includes a first source/drain region of a second conductivity type, such as N+ silicon source region 310, formed proximally to a sub-micron dimensioned interface between pillar 300 and substrate 305. Each pillar 300 also includes a second source/drain region of the second conductivity type, such as N+ silicon drain region 315, that is distal to substrate 305, and separated from source region 310 by a first conductivity type region, such as P− body region 320.

Each pillar 300 provides a source region 310, a drain region 315, and a body region 320 for the two floating gate transistors 200 of a particular memory cell 205. The two floating gate transistors 200 of each memory cell 205 are located on opposing sides of the pillar 300 therein. In one embodiment, the physical dimensions of each pillar 300 and the doping of P− body region 320 are both sufficiently small to allow operation of the floating gate transistors 200 that is characteristic of fully depleted body transistors. First source/drain region interconnection line YS1 electrically interconnects the source region 310 of each pillar 300 of cells 205AA, 205BA, . . . , 205NA. In one embodiment, the first source/drain interconnection lines YS1, YS2, . . . , YSN, comprise a conductively doped semiconductor of the second conductivity type, such as N+ silicon, disposed at least partially within substrate 305. For example, dopants can be ion-implanted or diffused into substrate 305 to form the first source/drain interconnection lines YS1, YS2, . . . , YSN. In another embodiment, the first source/drain interconnection lines YS1, YS2, . . . , YSN are formed above substrate 305.

For example, a doped epitaxial semiconductor layer can be grown on substrate 305, from which first source/drain interconnection lines YS1, YS2, . . . , YSN are formed. Alternatively, an undoped epitaxial semiconductor layer can be grown on substrate 305, and dopants then introduced by ion-implantation or diffusion to obtain the first source/drain interconnection lines YS1, YS2, . . . , YSN of the desired conductivity.

Each pillar 300 is outwardly formed from substrate 305, and is illustrated in FIG. 3A as extending vertically upward from substrate 305. Each pillar 300 has a top region that is separated from substrate 305 by four surrounding side regions. A floating gate 325 is formed substantially adjacent to two opposing side surfaces of pillar 300, and separated therefrom by a gate dielectric 330, such that there are two floating gates 325 per pillar 300, though FIG. 3A omits some of the floating gates 325 for clarity of illustration Each floating gate 325 has a corresponding substantially adjacent control gate 335, from which it is separated by an intergate dielectric 340. Except at the periphery of array 105, each control gate 335 is interposed between two approximately adjacent pillars 300 and shared by two floating gate transistors 200, each of these floating gate transistors 200 having portions in one of the two approximately adjacent pillars 300.

Also interposed between approximately adjacent pillars 300, except at the periphery of array 105, are gate lines XG1, XG2, . . . , XGN that are substantially parallel to each other. In this embodiment, gate lines XG1, XG2, . . . , XGN are illustrated as running in the X-direction, e.g. parallel to data lines XD1, XD2, . . . , XDN, but gate lines XG1, XG2, . . . , XGN could also run in the Y direction, e.g. orthogonal to data lines XD1, XD2, . . . , XDN. Each of the gate lines XG1, XG2, . . . , XGN interconnects ones of the control gates 335. For example, gate line XG2 electrically interconnects control gates 335 of floating gate transistors 200, in which the control gates are shared between pairs of cells 205, e.g. 205AA and 205BA, 205AB and 205BB, . . . , 205AN and 205BN. In the embodiment of FIG. 3A, the gate lines XG1, XG2, . . . , XGN are disposed above substrate 305, as described below.

Drain regions 315 of the pillars 300 are interconnected by data lines XD1, XD2, . . . , XDN that are substantially parallel to each other in the X-direction, e.g. parallel to gate lines XG1, XG2, . . . , XGN, but data lines XD1, XD2, . . . , XDN could also run in the Y direction, e.g. orthogonal to gate lines XG1, XG2, . . . , XGN. FIG. 3A illustrates, by way of example, data lines XD1 and XD2, which are shown schematically for clarity. However, it is understood that data lines XD1, XD2, . . . , XDN comprise metal or other interconnection lines that are isolated from the underlying topology, e.g. pillars 300, floating gates 325, control gates 335, and gate lines XG1, XG2, . . . , XGN, by an insulating layer through which contact holes are etched to access the drain regions 315 of the pillars 300.

Figure 3B:
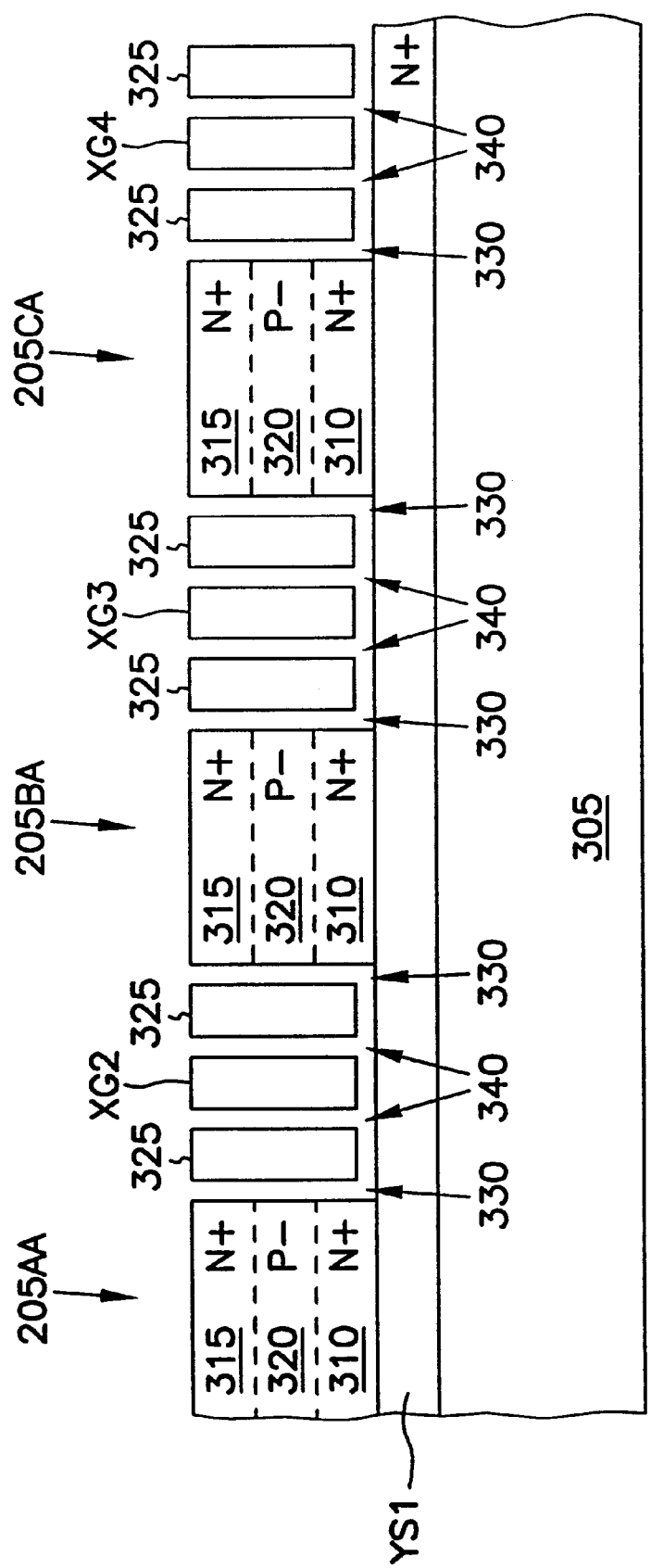
FIG. 3B is a cross-sectional view illustrating generally one embodiment of the invention.

FIG. 3B is a cross-sectional view illustrating generally one embodiment of the invention looking in the X-direction, e.g. parallel to data lines XD1, XD2, . . . , XDN and gate lines XG1, XG2, . . . , XGN, which run perpendicularly to the plane of the illustration of FIG. 3B. FIG. 3B illustrates a row of cells 205, e.g. 205AA, 205BA, . . . , 205NA, having source regions 310 interconnected by one of first source/drain interconnection lines YS1, YS2, . . . , YSN, e.g. first source/drain interconnection line YS1, formed in substrate 305.

Figure 4:
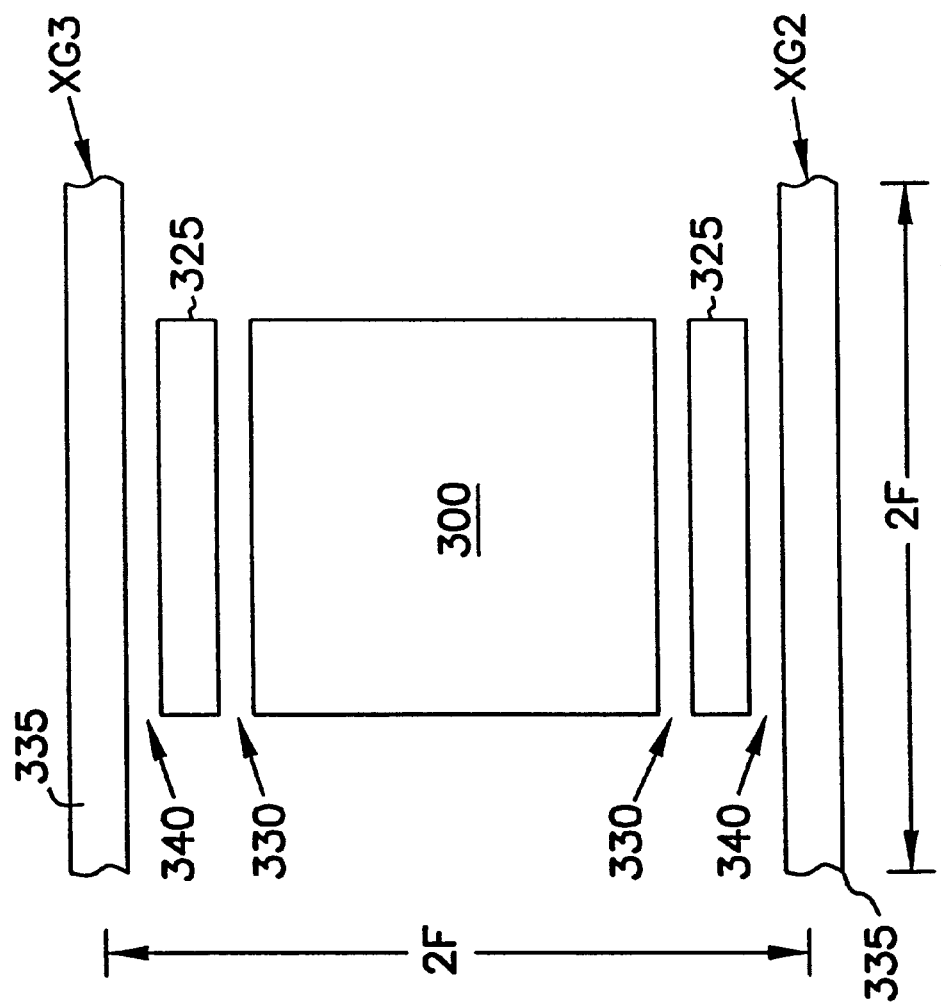
FIG. 4 is a plan view from above of a working surface of a substrate, which illustrates one embodiment of one of a memory cell according to the teachings of the invention.

FIG. 4 is a plan view, looking toward the working surface of substrate 305, illustrating generally by way of example one embodiment of one of cells 205 having two floating gate transistors 200, such as cell 205BB. In FIG. 4, each of the two floating gates 325 is adjacent to one of opposing sides of pillar 300, and separated therefrom by gate dielectric 330. Each control gate 335 is separated from a corresponding floating gate 325 by an intergate dielectric 340. Each control gate 335 is integrally formed together with one of the gate lines XG1, XG2, ..., XGN.

The center-to-center spacing ("pitch") between adjacent gate lines XG1, XG2, ..., XGN, e.g. between XG2 and XG3, is twice the minimum lithographic feature size F. Since two floating gate transistors 200 are contained within a cell 205 having an area of $4F^2$, an area of only $2F^2$ is needed per bit of data. In another embodiment, multiple charge states (more than two) are used to store more than one bit of data on a single floating gate transistor 200 in order to obtain correspondingly higher data storage densities. In one embodiment, four charge states are used to store two bits of data per floating gate transistor 200, corresponding to four bits of data per memory cell 205, such that an area of only $F^2$ is needed per bit of data. One example of using more than two charge states to store more than one bit of data per transistor is set forth an article by T. -S. Jung et al., entitled "A 117-mm$^2$ 3.3-V Only 128-Mb Multilevel NAND Flash Memory For Mass Storage Applications," *IEEE J. Solid-State Circuits*. Vol. 31, No. 11, November 1996. In a further embodiment, a continuum of charge states is used to store analog data in array 105.

In one embodiment, programming of one of the floating gate transistors 200 is by hot electron injection. For example, a voltage of approximately 10 volts is provided, such as by X gate decoder 115, through a particular one of gate lines XG1, XG2, ..., XGN to a particular control gate 335. A resulting inversion region (channel) is formed in the body region 320 at the surface that is approximately adjacent to the particular one of gate lines XG1, XG2, ..., XGN. A voltage of approximately 5 Volts is provided, such as by X source/drain decoder 125, through a particular one of data lines XD1, XD2, ..., XDN to a particular drain region 315. A voltage of approximately 0 Volts is provided, such as by Y source/drain decoder 120, through a particular one of first source/drain interconnection lines YS1, YS2, ..., YSN, to the particular source region 310 of the floating gate transistor 200. Electrons are injected onto the floating gate 325 interposed between the control gate 335 and the pillar 300 in which the particular drain region 315 is disposed. The exact value of the voltages provided to the particular control gate 335 and drain region 315 will depend on the physical dimension of the floating gate transistor 200, including the thickness of the gate dielectric 330, the thickness of the intergate dielectric 340, and the separation between source region 310 and drain region 315. Alternatively, if higher voltages are provided to control gate 335, and the gate dielectric 330 and intergate dielectric 340 are made thinner, the floating gate transistor 200 may be programmed instead by Fowler-Nordheim tunneling of electrons from the body region 320, source region 310, or drain region 315.

In one embodiment, addressing a particular memory cell 205 for reading data includes selecting a particular one of data lines XD1, XD2, ..., XDN and also selecting a particular one of first source/drain interconnection lines YS1, YS2, ..., YSN. Addressing a particular floating gate transistor 200 within the particular memory cell 205 for reading data either includes selecting a particular one of gate lines XG1, XG2, ..., XGN.

In one embodiment, reading data stored on a particular floating gate transistor 200 includes providing a voltage of approximately 5 volts by X gate decoder 115 through a particular one of the gate lines XG1, XG2, ..., XGN to the particular control gate 335 of the floating gate transistor 200. A voltage of approximately 0 Volts is provided, such as by Y source/drain decoder 120, through a particular one of first source/drain interconnection lines YS1, YS2, ..., YSN, to the particular source region 310 of the particular floating gate transistor 200. A particular one of data lines XD1, XD2, ..., XDN that is switchably coupled to the drain region 315 of the floating gate transistor 200 is precharged to a positive voltage by a sense amplifier in X source/drain decoder 125, then coupled to the drain region 315 to determine the conductivity state of the floating gate transistor 200 between its source region 310 and drain region 315.

If there are no electrons stored on the floating gate 325, the floating gate transistor 200 will conduct between its source region 310 and drain region 315, decreasing the voltage of the particular one of data lines XD1, XD2, ..., XDN toward that voltage of its source region 310, e.g. toward a "low" binary logic level voltage of approximately 0 Volts. If there are electrons stored on the floating gate 325, the floating gate transistor 200 will not conduct between its source region 310 and drain region 315. As a result, the sense amplifier will tend to increase the voltage of the particular one of data lines XD1, XD2, ..., XDN toward a positive voltage, e.g. toward a "high" binary logic voltage level.

In one embodiment, erasure of floating gate transistors 200 includes providing an erasure voltage difference of approximately between −10 and −12 Volts from a source region 310 to a corresponding control gate 335. For example, a voltage of approximately 0 Volts is provided, such as by Y source/drain decoder 120, to source regions 310 of floating gate transistors 200 that are interconnected by one or several first source/drain interconnection lines YS1, YS2, ..., YSN. A voltage of approximately between −10 and −12 Volts is provided, such as by X gate decoder 115, through a corresponding one or several of the gate lines XG1, XG2, ..., XGN to the control gates 335 of the floating gate transistors 200 to be erased. As a result of the negative voltage applied to the control gates 335, electrons are removed from the corresponding floating gates 325 by Fowler-Nordheim tunneling, thereby erasing the data from ones of the floating gate transistors 200. In another example, a voltage of approximately between −5 and −6 Volts is applied to the control gates 335 and a voltage of approximately between +5 and +6 Volts is applied to the source regions 310 in order to obtain the erasure voltage difference of approximately between −10 and −12 Volts from a source region 310 to a corresponding control gate 335. The exact value of the erasure voltage difference will vary depending upon the physical dimensions of the floating gate transistor 200 and the thicknesses of gate dielectric 330 and intergate dielectric 340.

In one embodiment, the entire array 105 of floating gate transistors 200 is simultaneously erased by applying approximately between −10 and −12 Volts to each of gate lines XG1, XG2, ..., XGN, and also applying 0 Volts to each of first source/drain interconnection lines YS1, YS2, ..., YSN. In another embodiment, one or more sectors of array 105 are simultaneously erased by selectively applying approximately between −10 and −12 Volts to one or more of gate lines XG1, XG2, ..., XGN, and also applying 0 Volts to one or more of first source/drain interconnection lines YS1, YS2, ..., YSN.

FIGS. 5–13 illustrate generally one embodiment of a method of forming memory array 105. In this embodiment, the array 105 is formed using bulk silicon processing techniques and is described, by way of example, with respect to a particular technology having a minimum lithographic feature size F, which is also sometimes referred to as a critical dimension (CD), of 0.4 microns. However, the process steps described below can be scaled accordingly for other minimum feature sizes without departing from the scope of the invention.

Figure 5:
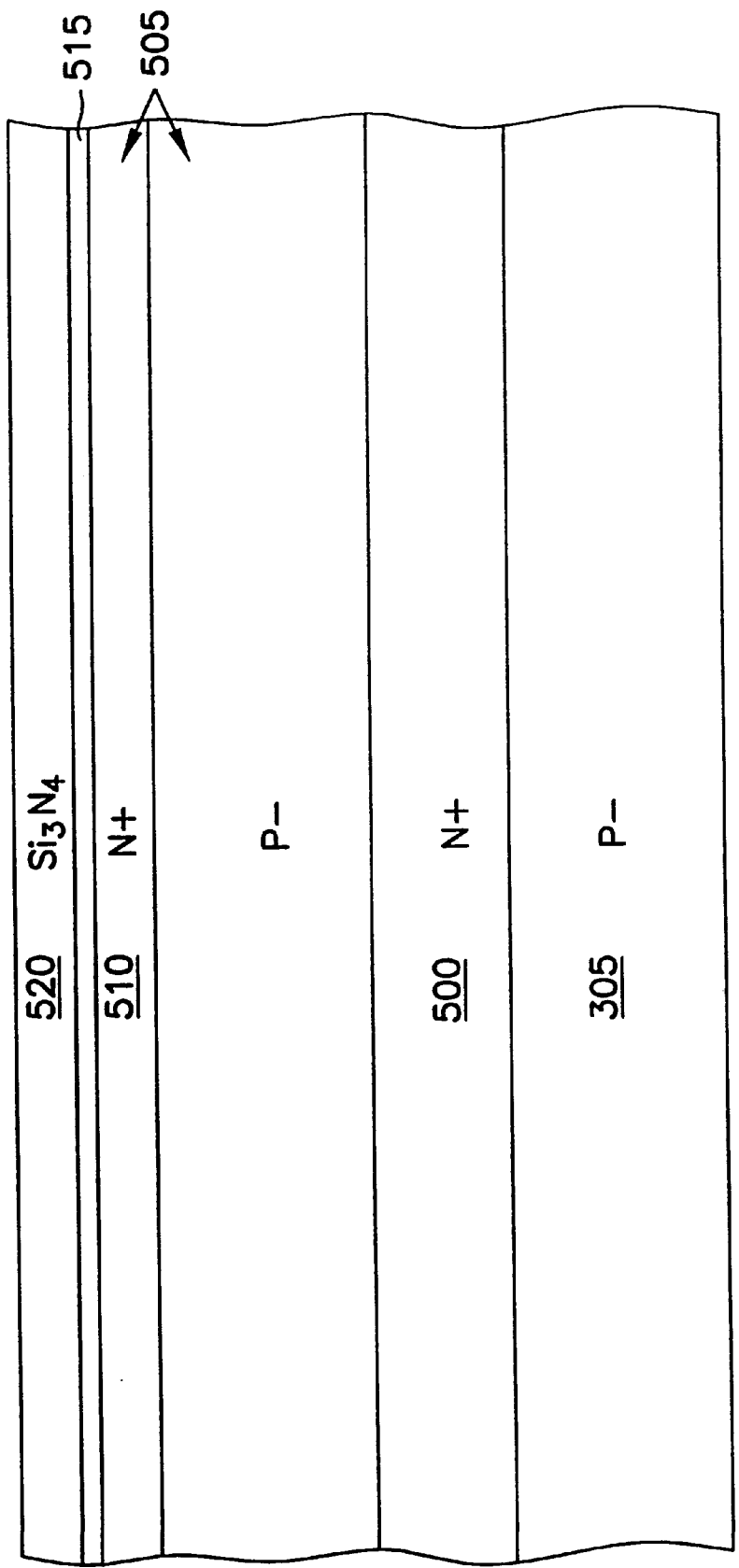
FIGS. 5–13 illustrate generally various stages of one embodiment of a method of forming an array of memory cells according to the teachings of the invention.

In FIG. 5, a P− silicon starting material is used for substrate 305. A first source/drain layer 500, of approximate thickness between 0.2 microns and 0.5 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P− silicon of 0.6 micron approximate thickness, is formed, such as by epitaxial growth. A second source/drain layer 510, such as N+ silicon of 150 nanometer approximate thickness, is formed at a surface of the epitaxial layer 505, such as by ion-implantation of donor dopants into P− epitaxial layer 505 or by epitaxial growth of N+ silicon on P− epitaxial layer 505. A thin layer of silicon dioxide ($SiO_2$), referred to as pad oxide 515, is deposited on the second source/drain layer 510. Pad oxide 515 has a thickness of approximately 10 nanometers. A layer of silicon nitride ($Si_3N_4$), preferred to as pad nitride 520, is deposited on the pad oxide 515. Pad nitride 520 has a thickness of approximately 100 nanometers.

Figure 6:
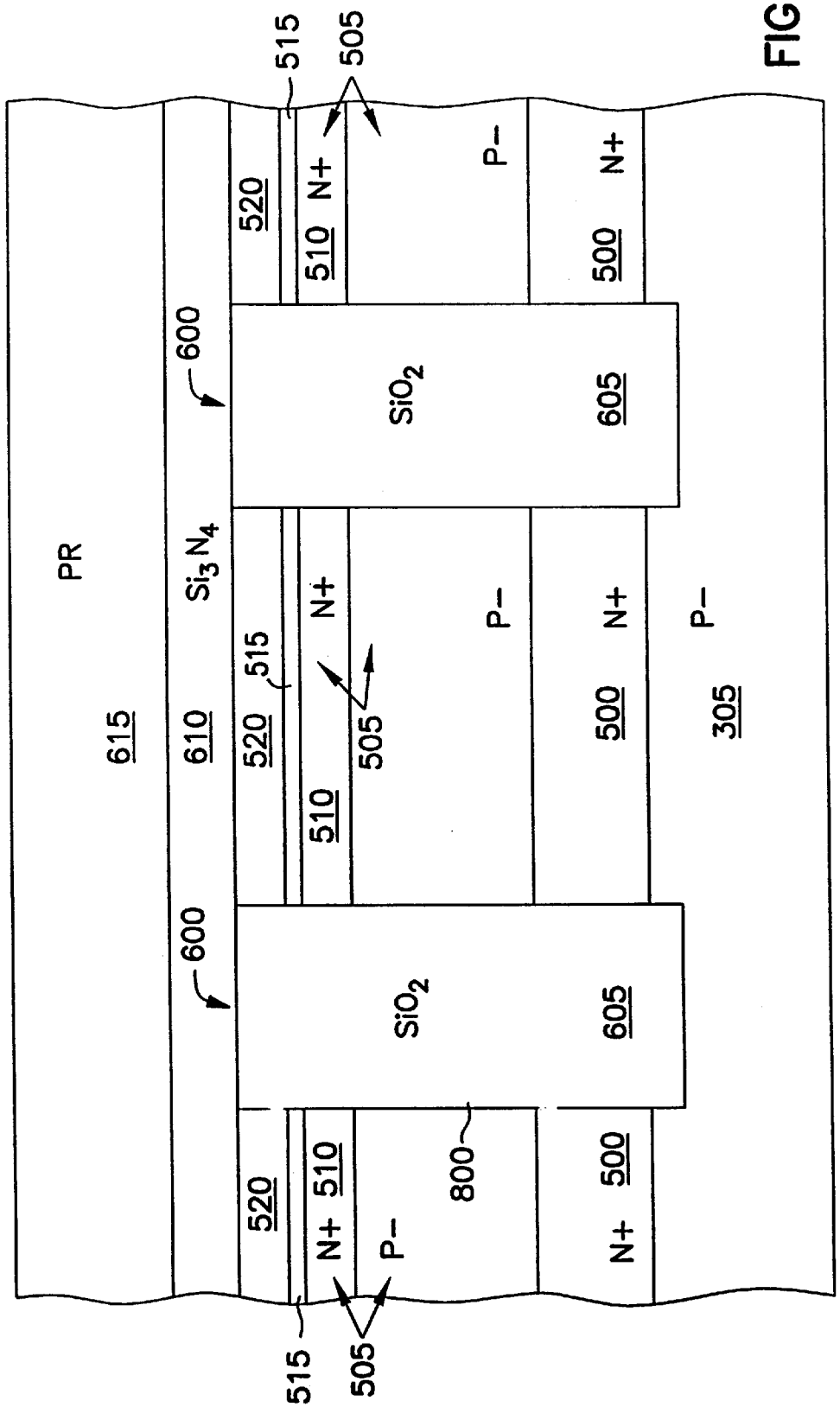

In the bulk silicon embodiment of FIG. 6, photoresist masking and selective etching techniques are used to form, in the first direction (e.g., the Y direction, which is perpendicular to the plane of the drawing of FIG. 6), a plurality of substantially parallel first troughs 600 that extend through the pad nitride 520, pad oxide 515, second source/drain layer 510, the underlying portion of epitaxial layer 505, first source/drain layer 500, and at least partially into underlying P− silicon substrate 305. The photoresist is then removed by conventional photoresist stripping techniques, and an insulator 605, such as silicon dioxide deposited by chemical vapor deposition (CVD), is formed to fill first troughs 600. The insulator 605 is planarized (e.g. exposing underlying portions of pad nitride 520) such as by chemical mechanical polishing (CMP) or other suitable planarization technique. A masking layer 610 such as, for example, silicon nitride deposited by CVD and having an approximate thickness of 200 nanometers, is then formed on insulator 605 and elsewhere on the working surface of substrate 305. A photoresist layer 615 is then formed on masking layer 610.

Figure 7:
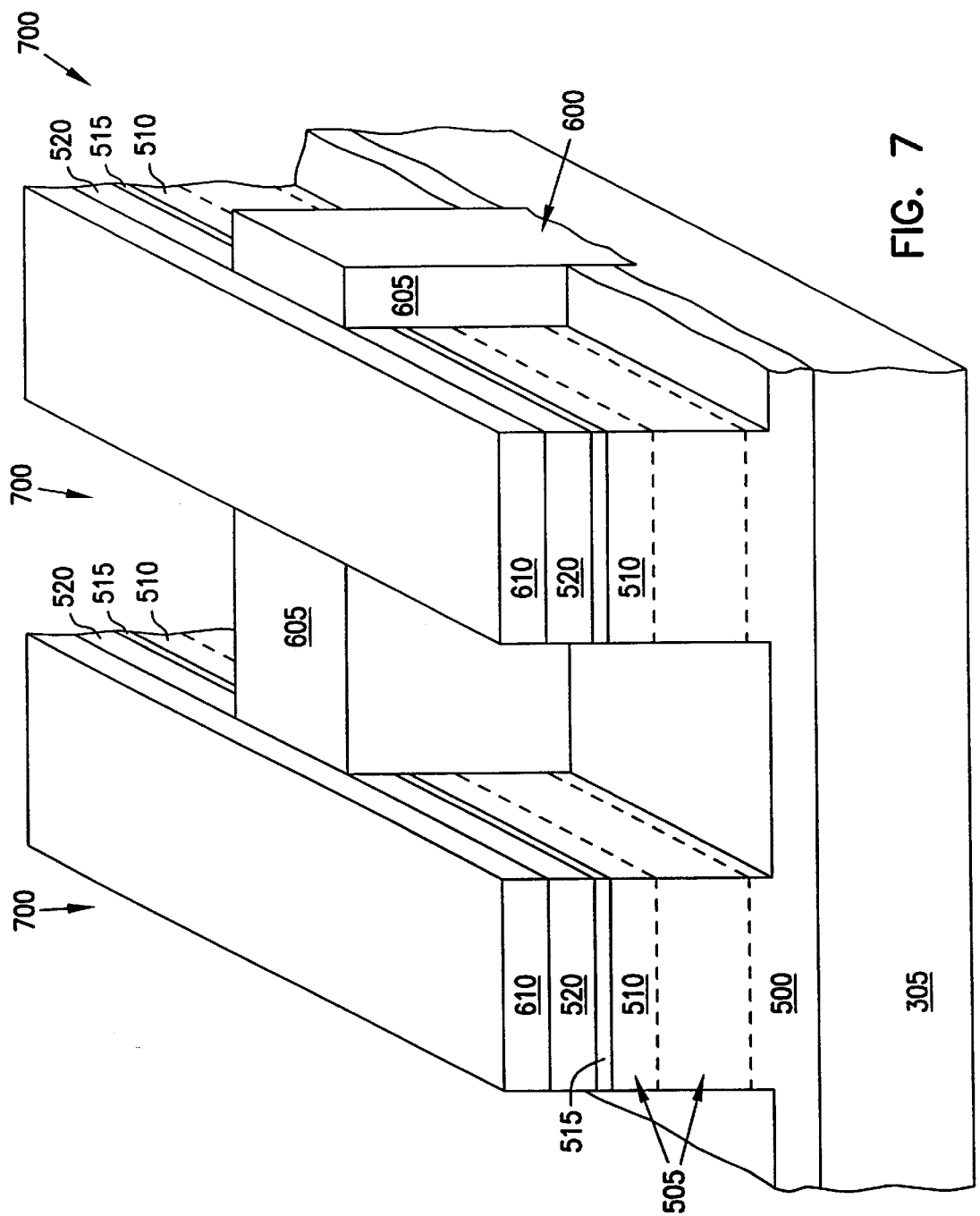

FIG. 7 is a perspective view, illustrating the selective etching, in a second direction (X-direction) that is substantially orthogonal to the first direction (Y-direction), of a plurality of substantially parallel second troughs 700, as described below. Forming second troughs 700 includes patterning photoresist layer 615, selectively etching masking layer 610, pad nitride 520, and underlying pad oxide 515, such that portions of silicon dioxide insulator 605 in the second troughs 700 are exposed, together with N+ silicon second source/drain layer 510. A selective etch, which preferentially removes silicon but doesn't substantially remove silicon dioxide, is used to etch through the exposed portions of second source/drain layer 510, the underlying portions of epitaxial layer 505, and approximately 100 nanometers into the underlying portions of first source/drain layer 500. Photoresist 615 is then removed by conventional photoresist stripping techniques, leaving the structure illustrated in FIG. 7.

Figure 8:
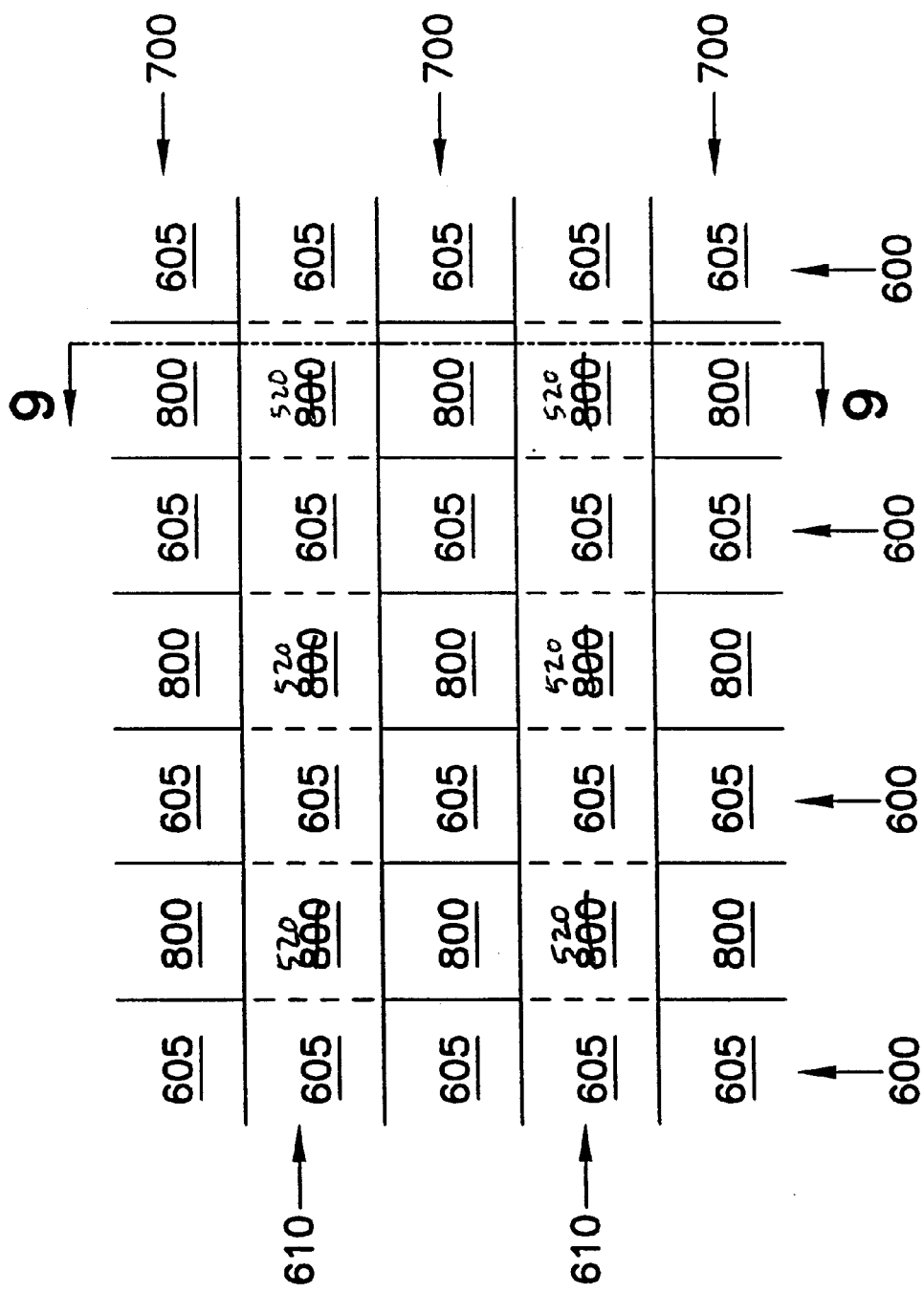

FIG. 8 is a plan view illustrating the resulting pattern formed by the selective etching steps described with respect to FIG. 7, which result in the forming of recesses 800 in second troughs 700 between first troughs 600.

Figure 9:
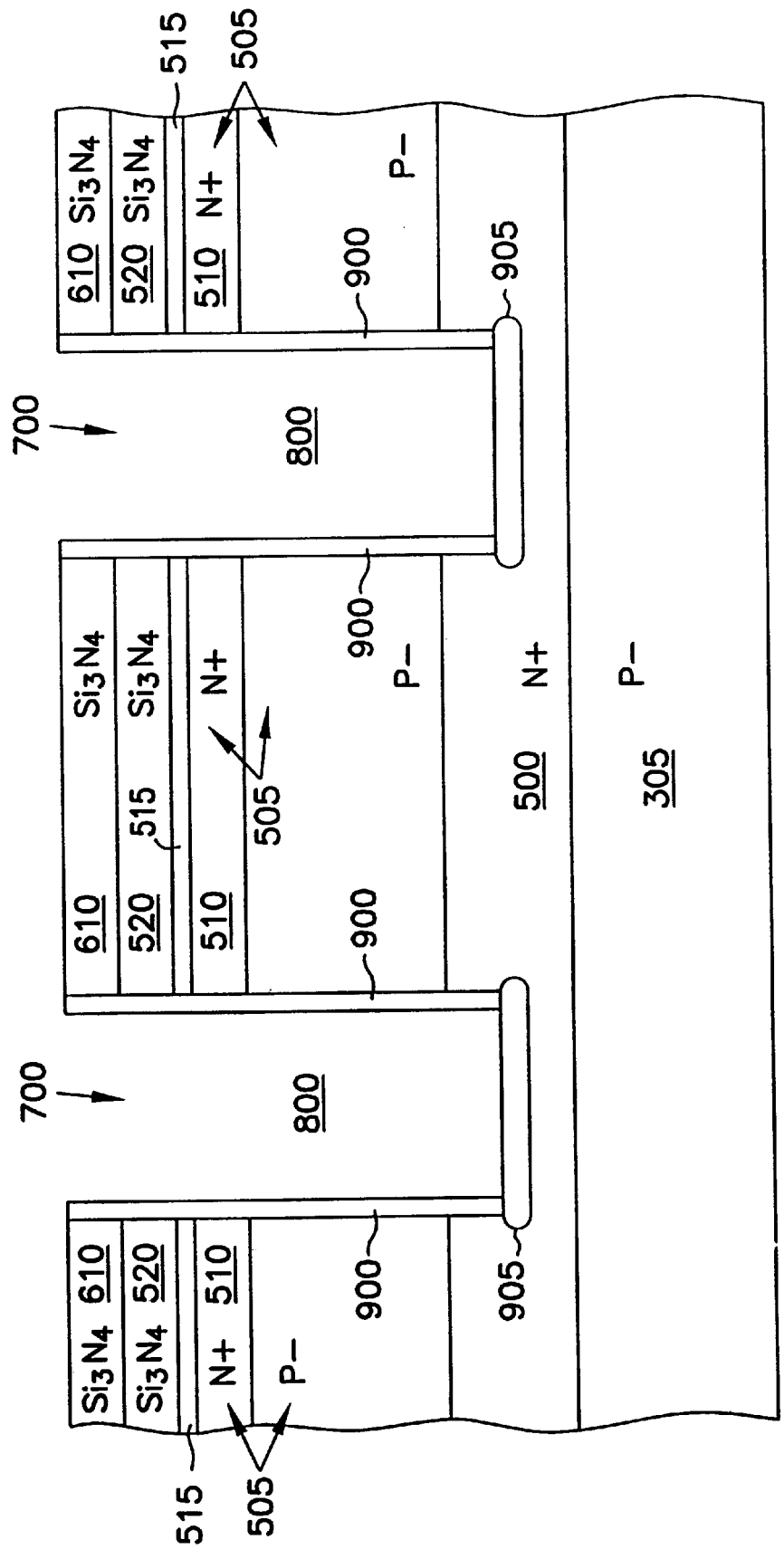

FIG. 9 is a cross-sectional view looking in the direction of second troughs 700 (e.g. such that the X-direction is orthogonal to the plane of the illustration of FIG. 9), as indicated by the cut line 9—9 in FIG. 8. In FIG. 9, a thin oxidation barrier layer 900, such as silicon nitride of approximate thickness of 20 nanometers, is conformally deposited by CVD to protect against the oxidation of sidewalls of second troughs 700. Barrier layer 900 is anisotropically etched to expose bottom portions of second troughs 700. A bottom insulation layer 905 is formed on the bottoms of second troughs 700, such as silicon dioxide of approximate thickness of 100 nanometers formed by thermal oxidation of the exposed bottom portions of second troughs 700.

Figure 10:
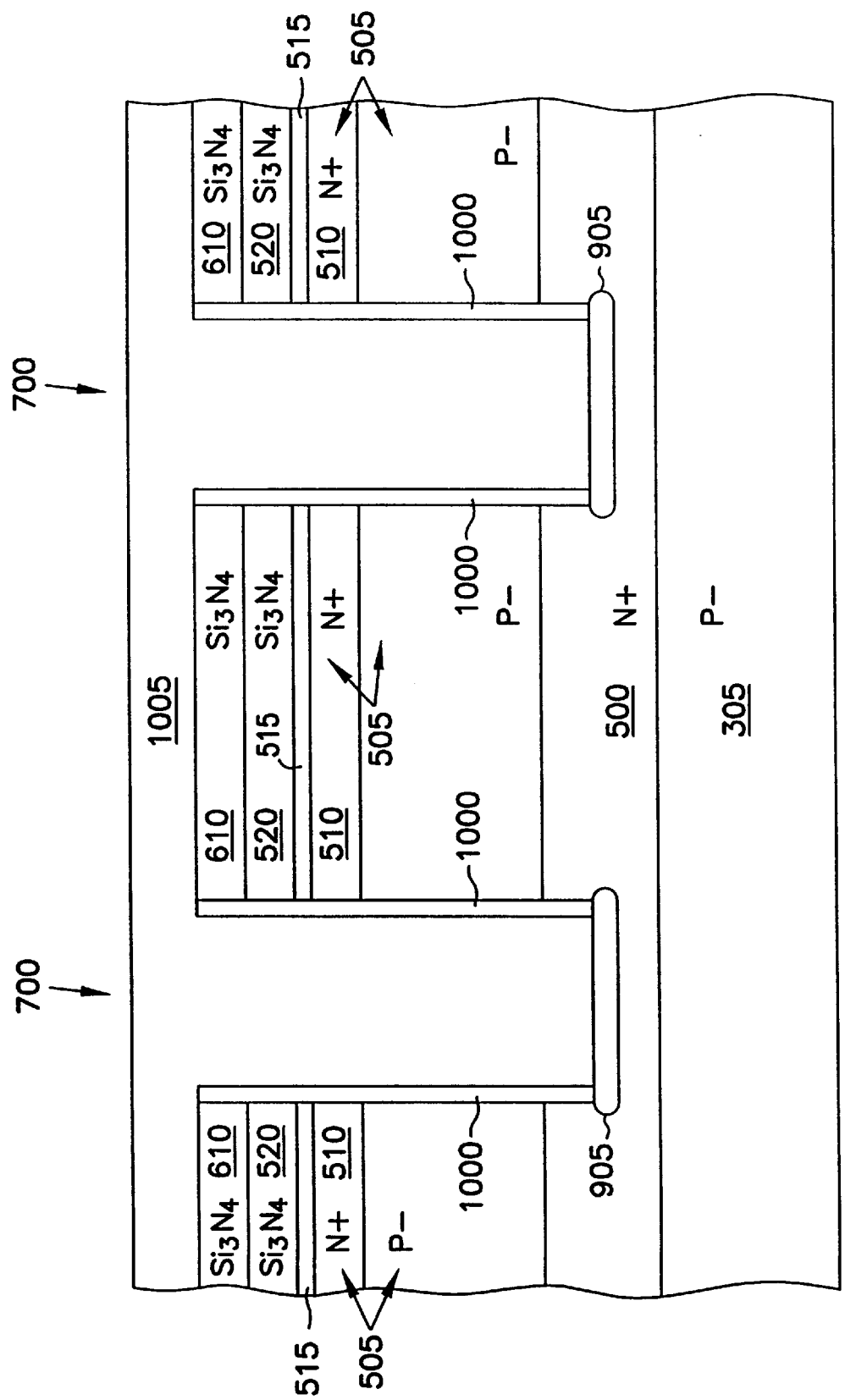

In FIG. 10, barrier layer 900 is stripped from the sidewalls of the second troughs 700, such as by a brief phosphoric acid etch, which is timed to expose the sidewalls of the second troughs 700 but which avoids significant removal of the thick silicon nitride masking layer 610. A gate dielectric layer 1000, such as silicon dioxide of thickness approximately between 5 nanometers and 10 nanometers (sometimes referred to as "tunnel oxide"), is formed substantially adjacent to the exposed sidewalls of the second troughs 700. A conductive layer 1005, such as N+ doped polysilicon, is formed in the second troughs 700, such as by CVD, to fill the second troughs 700. The conductive layer 1005 is planarized, such as by chemical mechanical polishing (CMP) or other suitable planarization technique.

Figure 11:
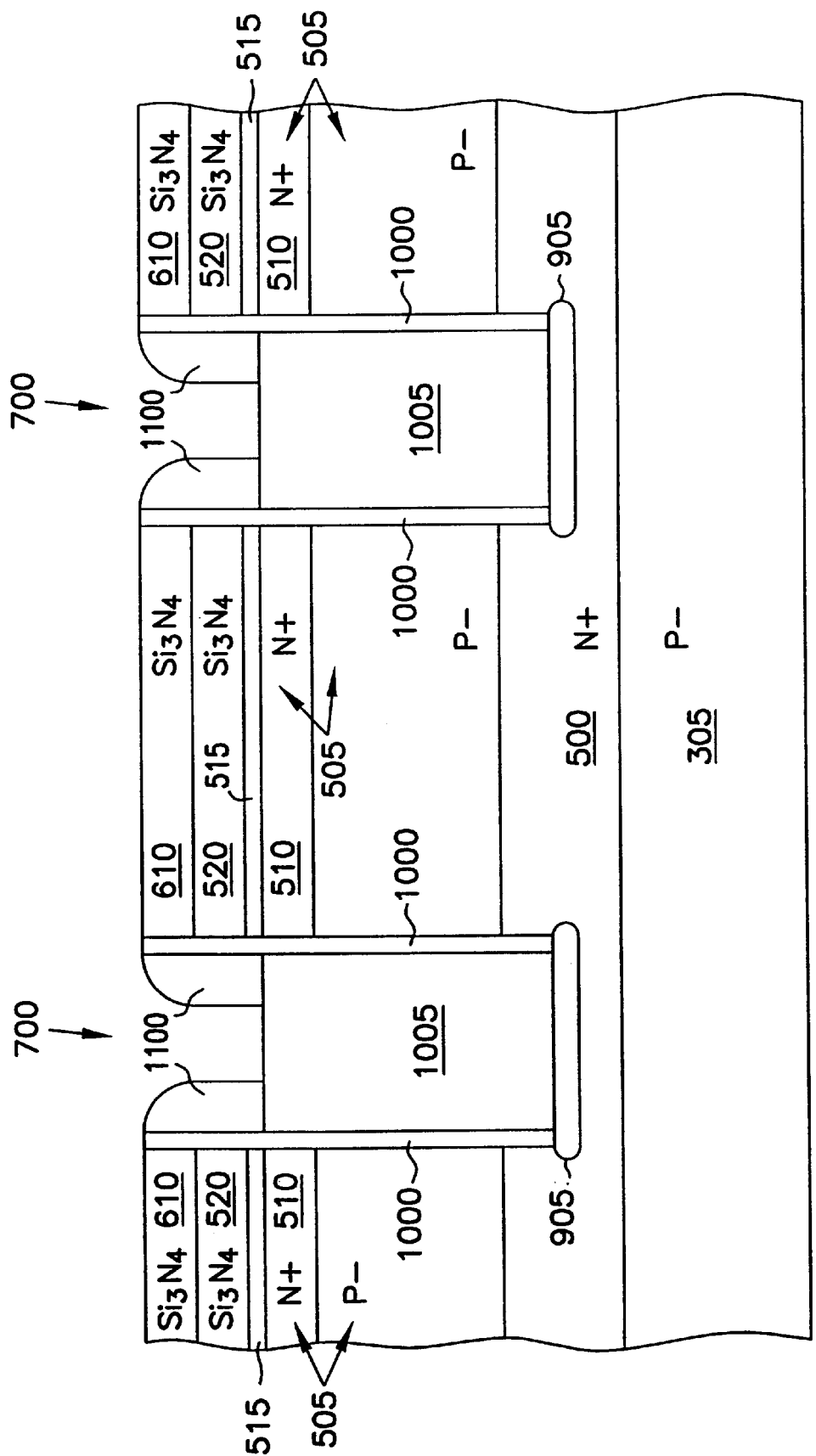

In FIG. 11, the conductive layer 1005 is etched back in the second troughs 700 to approximately at or slightly above the level of the silicon surface, which is defined by the interface between the second source/drain layer 510 and the pad oxide 515 layer. A spacer layer, such as silicon nitride of an approximate thickness of 100 nanometers, is deposited by CVD and anisotropically etched by reactive ion etching (RIE) to leave nitride spacers 1100 along the sidewalls of the second troughs 700, e.g. on the etched back portions of the conductive layer 1005, on the portions of insulator 605 in the intersections of first troughs 600 and second troughs 700, and against the second gate dielectric 1000.

Figure 12:
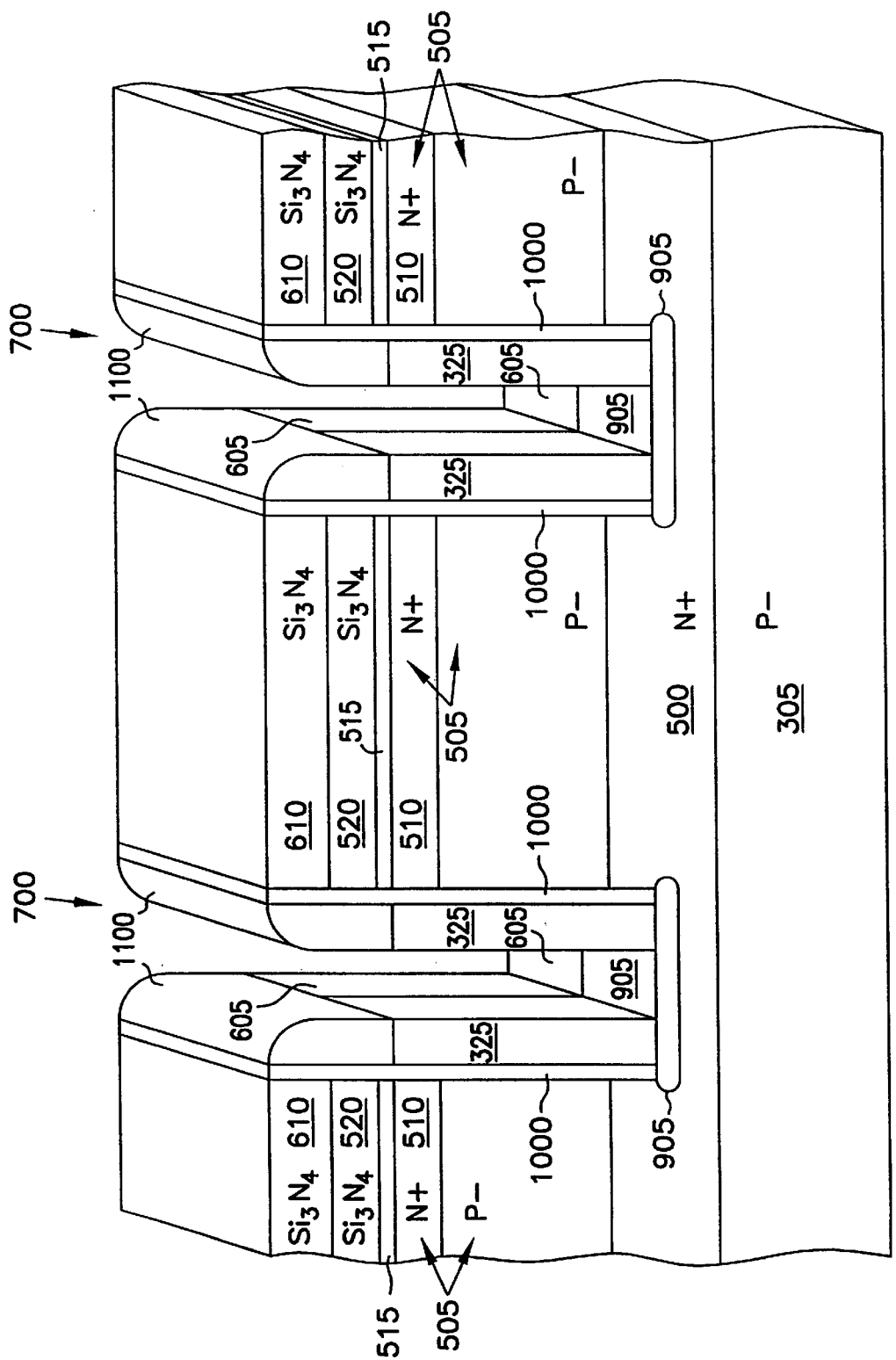

In the perspective view of FIG. 12, spacers 1100 are used as a mask for the anisotropic etching in the second troughs 700 of the etched back portions of polysilicon conductive layer 1005 and the portions of silicon dioxide insulator 605. A selective etch, which preferentially removes silicon dioxide but doesn't substantially remove polysilicon, is used to etch into portions of silicon dioxide insulator 605, but not the portions of polysilicon conductive layer 1005 in second troughs 700. The portions of silicon dioxide insulator 605 in second troughs 700 are etched until they are approximately even with adjacent portions of bottom insulating layer 905. Then, a selective etch, which preferentially removes polysilicon but doesn't substantially remove silicon doxide, is used to etch through portions of conductive layer 1005 in second troughs until the bottom insulation layer 905 is exposed, thereby forming from the polysilicon conductive layer 1005 separate floating gates 325 along the sidewalls of the second troughs 700.

Figure 13:
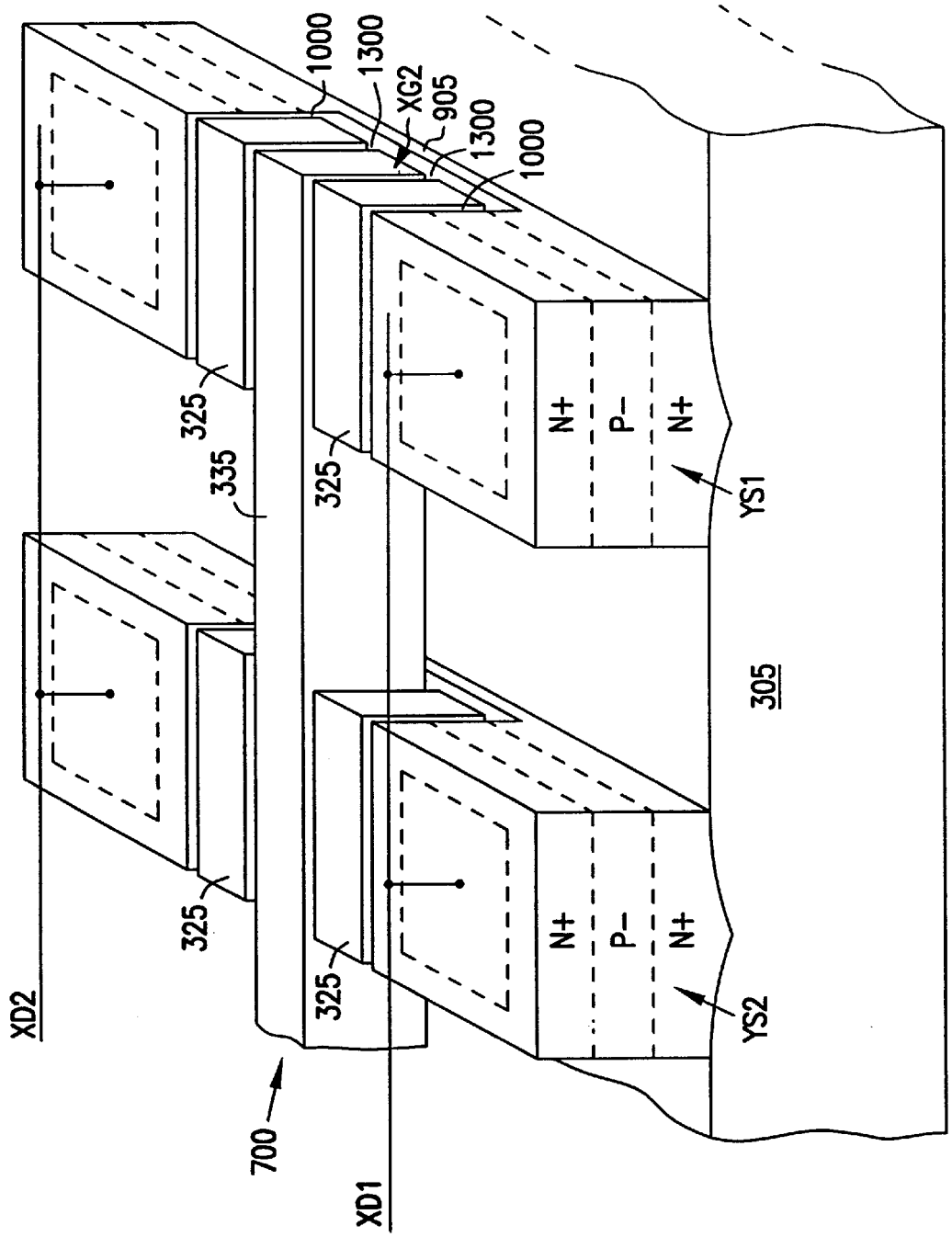

In the perspective view of FIG. 13, which is orthogonal to the perspective view of FIG. 12, an intergate dielectric 1300 is formed in the second troughs 700, such that the intergate dielectric 1300 has an approximate thickness between 7 nanometers and 15 nanometers. In one embodiment, formation of intergate dielectric 1300 is by thermal growth of silicon dioxide. In another embodiment, formation of intergate dielectric 1300 is by deposition of oxynitride by CVD. Control gates 335 are formed between opposing floating gates 325 in the second troughs 700 and separated therefrom by the intergate dielectric 1300. The control gates 335 in second troughs 700 are formed together with the gate lines XG1, XG2, . . . , XGN in second troughs 700 by a single deposition of N+ doped polysilicon that fills second troughs 700 and is planarized, such as by CMP down to the top level of silicon nitride masking layer 610. Phosphoric acid is used to remove the remaining silicon nitride, such as spacers 1100, masking layer 610, and pad nitride 520, leaving the structure illustrated in FIG. 13. An insulator such as silicon dioxide is then deposited, and subsequent processing follows conventional techniques for forming contact holes, terminal metal, and inter level insulator steps to complete wiring of the cells 205 and other circuits of memory 100.

Though FIGS. 5–13 illustrate generally one embodiment of forming the memory array 105 using bulk silicon processing techniques, in another embodiment a semiconductor-on-insulator (SOI) substrate is formed from substrate 305. In one such embodiment, a P– silicon staring material is used for substrate 305, and processing begins similarly to the bulk semiconductor embodiment described in FIG. 5. However, after the first troughs 600 are formed in FIG. 6, an oxidation barrier layer is formed on the sidewalls of the first troughs 600. An isotropic chemical etch is used to fully undercut the semiconductor regions separating the first troughs 600, and a subsequent oxidation step is used to fill in the evacuated regions formed by the undercutting. As a result, an insulator is formed on the bottoms of first troughs 600, bars of SOI are formed between first troughs 600, and the topography on the working surface of substrate 305 is separated from substrate 305 by an insulating layer. The barrier layer is then removed from the sidewalls of first troughs 600, which are then filled with insulator 605, as illustrated in FIG. 6. Thus, in the above described Figures, substrate 305 is understood to include bulk semiconductor as well as SOI embodiments in which the semiconductor integrated circuits formed on the surface of substrate 305 are isolated from each other and an underlying semiconductor portion of substrate 305 by an insulating layer.

One such method of forming bars of SOI is described in the Noble U.S. patent application Ser. No. 08/745,708 which is assigned to the assignee of the present application and which is herein incorporated by reference. Another such method of forming regions of SOI is described in the Forbes U.S. patent application Ser. No. 08/706,230, which is assigned to the assignee of the present application and which is herein incorporated by reference.

Thus, the present invention provides a high density flash EEPROM having increased nonvolatile storage capacity. If a floating gate transistor 200 is used to store a single bit of data, an area of only $2F^2$ is needed per bit of data. If multiple charge states (more than two) are used, even less area is needed per bit of data, e.g. an area of $F^2$ is needed per bit of data when four charge states are used. The increased storage capacity of the high density flash EEPROM is particularly advantageous in replacing hard disk drive data storage in computer systems. In such an application, the delicate mechanical components included in the hard disk drive are replaced by rugged, small, and durable solid-state high density flash EEPROM packages. The high density flash EEPROMs provide improved performance, extended rewrite cycles, increased reliability, lower power consumption, and improved portability.

It is to be understood that the above description is intended to be illustrative, and not restrictive. Many other embodiments will be apparent to those of skill in the art upon reviewing the above description For example, though the memory cells 205 have been described with respect to a particular embodiment having two floating gate transistors 200 per pillar 300, a different number of floating gate transistors per pillar could also be used. It is also understood that the above structures and methods, which have been described with respect to EEPROM memory devices having floating gate transistors 200, are also applicable to dynamic random access memories (DRAMs) or other integrated circuits using vertically oriented field-effect transistors that do not have floating gates. Thus, the scope of the invention is not limited to the particular embodiments shown and described herein.

What is claimed is:

1. A method of forming a memory array, the method comprising the steps of:

forming a plurality of first conductivity type semiconductor pillars upon a substrate, each pillar having top and side surfaces;

forming a plurality of first source/drain regions, of a second conductivity type, each of the first source/drain regions formed proximally to an interface between a pillar and the substrate;

forming a plurality of second source/drain regions, of a second conductivity type, each of the second source/drain regions formed within one of the pillars and distal to the substrate and separate from the first/source drain/region;

forming a gate dielectric on at least a portion of the side surface of the pillars;

forming a plurality of floating gates, each of the floating gates formed substantially adjacent to a portion of the side surface of one of the pillars and separated therefrom by the gate dielectric;

forming a plurality of control gates, each of the control gates formed substantially adjacent to one of the floating gates and insulated therefrom;

forming a intergate dielectric, interposed between ones of the floating gates and one of the control gates;

forming a plurality of gate lines that interconnect one of the control gates;

forming at least one first source/drain interconnection line interconnecting one of the first source/drain regions; and forming a plurality of data lines, each data line interconnecting one of the second source drain/regions.

2. The method of claim 1, further comprising the step of forming an insulating layer between the semiconductor pillars and a semiconductor portion of the substrate.

3. The method of claim 1, wherein the step of forming the at least one first source/drain interconnection line is carried out at least partially within the substrate.

4. The method of claim 1, wherein the step of forming the plurality of gate lines includes forming a plurality of substantially parallel gate lines.

5. The method of claim 1, wherein the step of forming the plurality of pillars further comprises the steps of:

growing an epitaxial layer on the substrate;

etching the epitaxial layer and a portion of the substrate to form a plurality of first troughs therein for carrying an insulator; and etching the epitaxial layer to form therein a plurality of second troughs, substantially orthogonal to the plurality of first troughs, the second troughs for carrying the gate lines.

6. The method of claim 5, wherein the step of forming the plurality of floating gates comprises the steps of:

depositing polysilicon in the second troughs; and etching the deposited polysilicon in a median portion of the second troughs to form one of the floating gates on either side of the second troughs, each floating gate adjacent to one of the pillars but separated therefrom by the gate dielectric.

7. The method of claim 6, wherein the steps of forming the plurality of gate lines comprises the steps of:

etching into the substrate in a median portion of the second troughs; and depositing conductive polysilicon in and above the substrate in the etched median portion of the second troughs to form the gate lines and one of the control gates.

8. The method of claim 1, wherein the step of forming the plurality of second source/drain regions comprises the step of ion-implanting a dopant of the second conductivity type.

9. The method of claim 1, wherein the step of forming the gate dielectric comprises the step of growing on the side surface of each pillar a layer of silicon dioxide of thickness approximately between 5 nanometers and 10 nanometers.

10. The method of claim 1, wherein the step of forming the plurality of data lines comprises the steps of:

depositing an insulator over the pillars, the floating and control gates, and first and second gate lines;

forming contact holes in the insulator to contact the second/source drain regions of each pillar;

depositing a conductive layer on the insulator and in the contact holes; and etching the conductive layer to form data lines.

11. A method of forming a memory array on a substrate, the method comprising the steps of:

forming a first source/drain layer at a surface of the substrate;

forming a semiconductor epitaxial layer on the first source/drain layer;

forming a second source/drain layer at a surface of the epitaxial layer;

etching, in a direction, a plurality of substantially parallel first troughs in the epitaxial layer;

forming an insulator in the first troughs;

etching, in a second direction that is substantially orthogonal to the first direction, a plurality of substantially parallel second troughs in the epitaxial layer;

forming a gate dielectric layer substantially adjacent to sidewall regions of the second troughs;

forming a conductive layer in the second troughs;

removing a portion of the conductive layer in the second troughs such that floating gate regions are formed along the sidewall regions therein and separated from the sidewall regions by the gate dielectric layer;

forming an intergate dielectric layer on exposed portions of the floating gate regions in the second troughs; and forming control gate regions and gate lines between opposing floating gate regions in the second troughs and separated from the floating gate regions in the second troughs by the intergate dielectric layer.

12. The method of claim 11, wherein the substrate is a bulk semiconductor.

13. The method of claim 11, wherein the substrate includes a semiconductor-on-insulator portion.

14. The method of claim 11, further comprising forming an insulating layer undercutting semiconductor regions between the first troughs.

* * * * *

UNITED STATES PATENT AND TRADEMARK OFFICE
CERTIFICATE OF CORRECTION

PATENT NO.: 6,143,636
DATED: Nov. 07, 2000
INVENTOR(S): Forbes et al.

It is certified that errors appear in the above-identified patent and that said Patent is hereby corrected as shown below:

In column 12, lines 29-30, delete "first/source drain/region" and insert --first source / drain region--, therefor.

In column 12, line 40, delete "ones" and insert --one--, therefor.

In column 14, line 7, insert --first-- before "direction".

Signed and Sealed this

Twenty-ninth Day of May, 2001

*Attest:*

NICHOLAS P. GODICI

*Attesting Officer*   *Acting Director of the United States Patent and Trademark Office*